(12) United States Patent
Sharma et al.

(10) Patent No.: US 11,876,047 B2
(45) Date of Patent: Jan. 16, 2024

(54) DECOUPLED INTERCONNECT STRUCTURES

(71) Applicant: International Business Machines Corporation, Armonk, NY (US)

(72) Inventors: Saumya Sharma, Easton, CT (US); Ashim Dutta, Clifton Park, NY (US); Tianji Zhou, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 17/447,586

(22) Filed: Sep. 14, 2021

(65) Prior Publication Data
US 2023/0081953 A1 Mar. 16, 2023

(51) Int. Cl.
| | | |
|---|---|---|
| H01L 21/00 | (2006.01) | |
| *H01L 23/528* | (2006.01) | |
| *H01L 21/768* | (2006.01) | |
| H01L 23/522 | (2006.01) | |
| H10B 61/00 | (2023.01) | |
| H10B 63/00 | (2023.01) | |

(52) U.S. Cl.
CPC ...... *H01L 23/528* (2013.01); *H01L 21/76816* (2013.01); *H01L 21/76879* (2013.01); *H01L 21/76843* (2013.01); *H01L 23/5226* (2013.01); *H10B 61/00* (2023.02); *H10B 63/00* (2023.02)

(58) Field of Classification Search
CPC ............ H01L 23/528; H01L 21/76816; H01L 21/76879
See application file for complete search history.

(56) References Cited

U.S. PATENT DOCUMENTS

| | | |
|---|---|---|
| 5,804,458 A | 9/1998 | Tehrani et al. |
| 6,265,308 B1 | 7/2001 | Bronner et al. |
| 6,365,419 B1 | 4/2002 | Durlam et al. |
| 6,380,084 B1 | 4/2002 | Lim et al. |
| 6,475,857 B1 | 11/2002 | Kim et al. |

(Continued)

FOREIGN PATENT DOCUMENTS

| | | | | |
|---|---|---|---|---|
| CN | 1536643 A | * | 10/2004 | ....... H01L 21/76829 |
| CN | 101490827 A | * | 7/2009 | ....... H01L 21/76805 |

(Continued)

*Primary Examiner* — Laura M Menz
(74) *Attorney, Agent, or Firm* — Kelli D. Morin

(57) ABSTRACT

A semiconductor component includes an insulative layer having a lowermost surface arranged on top of a bottom dielectric material. The semiconductor component further includes a first interconnect structure arranged in the bottom dielectric material such that an uppermost surface of the first interconnect structure is arranged at a first height relative to the lowermost surface of the insulative layer. The semiconductor component further includes a pillar connected to the first interconnect structure and extending through the insulative layer. The semiconductor component further includes a second interconnect structure arranged in the bottom dielectric material such that an uppermost surface of the second interconnect structure is arranged at a second height relative to the lowermost surface of the insulative layer. The second height is different than the first height.

13 Claims, 12 Drawing Sheets

(56) References Cited

U.S. PATENT DOCUMENTS

| | | | |
|---|---|---|---|
| 6,972,209 B2* | 12/2005 | Agarwala | H01L 23/5226 |
| | | | 257/E21.582 |
| 8,754,526 B2* | 6/2014 | Yang | H01L 21/76831 |
| | | | 257/750 |
| 8,841,214 B2 | 9/2014 | Lee et al. | |
| 9,171,778 B2* | 10/2015 | Coolbaugh | H01L 21/76832 |
| 9,171,801 B2 | 10/2015 | Bao et al. | |
| 9,418,933 B2 | 8/2016 | Lin et al. | |
| 9,721,891 B2* | 8/2017 | Xu | H01L 21/76882 |
| 9,793,163 B2 | 10/2017 | Bristol et al. | |
| 9,793,212 B2* | 10/2017 | Huang | H01L 23/5226 |
| 10,319,629 B1 | 6/2019 | Yang | H01L 21/76834 |
| 11,018,090 B2* | 5/2021 | Rizzolo | H01L 23/544 |
| 11,024,577 B1* | 6/2021 | Park | H01L 23/5252 |
| 11,398,480 B2* | 7/2022 | Zhang | H01L 29/0665 |
| 2002/0187625 A1* | 12/2002 | Shimooka | H01L 21/76834 |
| | | | 438/618 |
| 2006/0014376 A1* | 1/2006 | Agarwala | H01L 21/76829 |
| | | | 257/E21.582 |
| 2007/0040276 A1* | 2/2007 | Yang | H01L 23/5252 |
| | | | 257/758 |
| 2009/0278228 A1* | 11/2009 | Hsu | H01L 23/53295 |
| | | | 257/E23.149 |
| 2014/0319650 A1* | 10/2014 | Coyner | H01L 23/53295 |
| | | | 438/467 |
| 2015/0123282 A1* | 5/2015 | Kim | H10N 50/10 |
| | | | 257/773 |
| 2017/0040258 A1* | 2/2017 | Bruce | H01L 21/76892 |
| 2017/0263547 A1* | 9/2017 | Adusumilli | H01L 23/53266 |
| 2018/0151489 A1* | 5/2018 | Adusumilli | H01L 23/5226 |
| 2019/0214554 A1 | 7/2019 | Li et al. | |
| 2020/0051924 A1* | 2/2020 | Rizzolo | H01L 23/544 |
| 2020/0388757 A1* | 12/2020 | Yang | H10N 70/826 |
| 2021/0082751 A1* | 3/2021 | Yang | H01L 23/5226 |
| 2021/0225759 A1* | 7/2021 | Park | H01L 21/31144 |
| 2021/0225774 A1* | 7/2021 | Yang | H10N 50/80 |
| 2021/0358911 A1* | 11/2021 | Zhang | H01L 29/775 |
| 2023/0055600 A1* | 2/2023 | Mukesh | H01L 21/76885 |
| 2023/0081953 A1* | 3/2023 | Sharma | H01L 21/76879 |
| | | | 257/107 |
| 2023/0084739 A1* | 3/2023 | Metzler | H01L 21/7684 |
| | | | 438/618 |
| 2023/0120110 A1* | 4/2023 | Motoyama | H01L 21/76885 |
| | | | 257/774 |
| 2023/0123372 A1* | 4/2023 | Lanzillo | H01L 23/5226 |
| | | | 257/774 |
| 2023/0125615 A1* | 4/2023 | Park | H01L 21/76846 |
| | | | 257/773 |
| 2023/0137421 A1* | 5/2023 | van der Straten | H10B 61/00 |
| | | | 257/421 |
| 2023/0144842 A1* | 5/2023 | Lanzillo | H01L 21/76849 |
| | | | 257/750 |
| 2023/0146034 A1* | 5/2023 | Rizzolo | H10N 30/01 |
| | | | 257/5 |
| 2023/0207387 A1* | 6/2023 | Mukesh | H01L 21/76885 |
| | | | 257/295 |
| 2023/0262992 A1* | 8/2023 | Xie | H10N 50/01 |
| | | | 257/421 |
| 2023/0268275 A1* | 8/2023 | Farooq | H01L 24/13 |
| | | | 257/642 |

FOREIGN PATENT DOCUMENTS

| | | | | |
|---|---|---|---|---|
| JP | 2003151982 A | | 5/2003 | |
| WO | 0203457 A3 | | 1/2002 | |
| WO | 2015026390 A1 | | 2/2015 | |
| WO | WO-2017171840 A1 * | | 10/2017 | H01L 27/222 |
| WO | WO-2023035739 A1 * | | 3/2023 | H01L 21/32139 |

* cited by examiner

DECOUPLED INTERCONNECT STRUCTURES

BACKGROUND

The present disclosure relates to the electrical, electronic, and computer fields. In particular, the present disclosure relates to the interconnects of semiconductor devices and methods of making the interconnects of semiconductor devices.

In integrated circuits, interconnects are structures that connect two or more circuit elements together electrically. Lines are interconnect structures that provide electrical connection within a single layer, and vias are interconnect structures that provide electrical connection between layers in a physical electronic circuit.

SUMMARY

Embodiments of the present disclosure include a semiconductor component. The semiconductor component includes an insulative layer having a lowermost surface arranged on top of a bottom dielectric material. The semiconductor component further includes a first interconnect structure arranged in the bottom dielectric material such that an uppermost surface of the first interconnect structure is arranged at a first height relative to the lowermost surface of the insulative layer. The semiconductor component further includes a device connected to the first interconnect structure and extending through the insulative layer. The semiconductor component further includes a second interconnect structure such that an uppermost surface of the second interconnect structure is arranged at a second height relative to the lowermost surface of the insulative layer. The second height is different than the first height.

Additional embodiments of the present disclosure include a method for making a semiconductor component. The method includes forming a first interconnect structure in a bottom dielectric material. The first interconnect structure has an uppermost surface. The method further includes forming an insulative layer on top of the bottom dielectric material such that the insulative layer covers the uppermost surface of the first interconnect structure. The method further includes forming a pillar in contact with the first interconnect structure such that the pillar extends through the insulative layer. The method further includes forming a second interconnect structure extending through the insulative layer.

Additional embodiments of the present disclosure include a semiconductor component. The semiconductor component includes a bottom dielectric material. The semiconductor component further includes an insulative layer arranged on top of the bottom dielectric material. The semiconductor component further includes a first interconnect structure formed in the bottom dielectric material such that an uppermost surface of the first interconnect structure is arranged below the insulative layer. The semiconductor component further includes a pillar formed in direct contact with the first interconnect structure such that the pillar extends through the insulative layer. The semiconductor component further includes a second interconnect structure formed in the bottom dielectric material and extending through the insulative layer.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
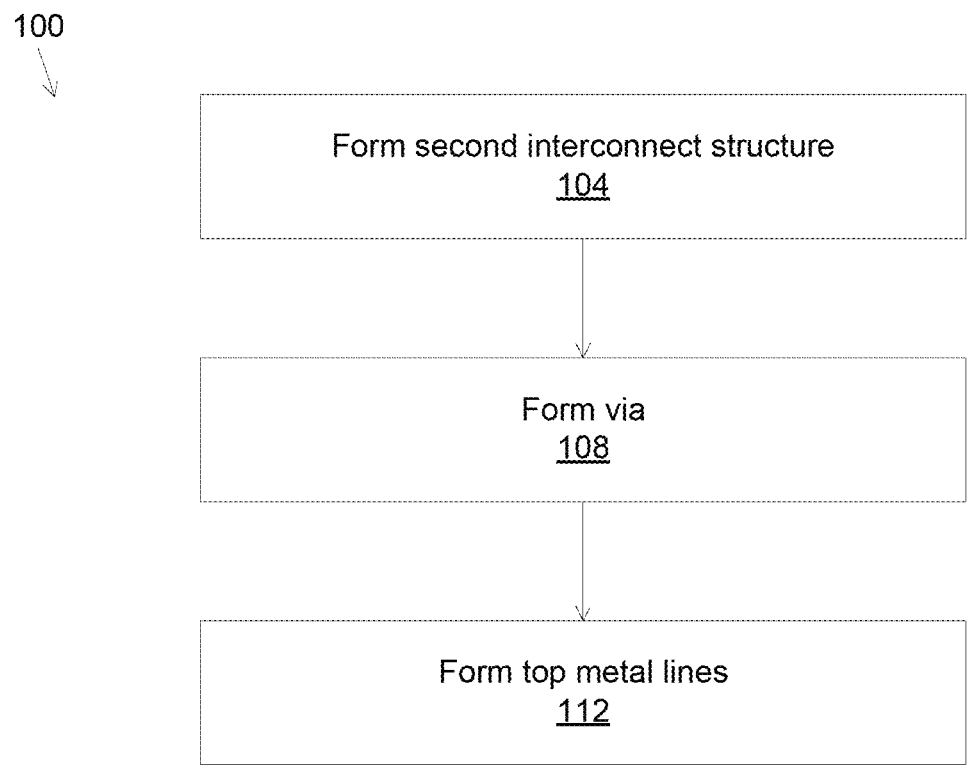
FIG. 1 illustrates a flowchart of an example method for forming a semiconductor component, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the electrical, electronic, and computer fields. In particular, the present disclosure relates to semiconductor devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, in integrated circuits, interconnects are structures that connect two or more circuit elements (such as transistors or power rails) together electrically. In addition to providing the electrical connection to the front end devices (such as transistors), interconnects also go all the way back to the power delivery networks. Thus, interconnects, and their surrounding support components, are considered back-end-of-line (BEOL) components. Lines are interconnect structures that provide electrical connection within a single layer, and vias are interconnect structures that provide electrical connection between layers in a physical electronic circuit.

In general, the various processes used to form lines and vias for a semiconductor chip or micro-chip that will be packaged into an IC fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up a transistor and the many wires that connect the millions of transistors of a circuit, lithography and etch pattern transfer steps are repeated multiple times. Each pattern being printed on the substrate is aligned to previously formed patterns, and gradually the conductive and insulative regions are built up to form the final device.

These processes can be used in different combinations and orders within the context of two main integration schemes for forming interconnect structures. A damascene flow refers to the processes of forming interconnect structures by depositing an oxide layer, forming a trench into the oxide layer, and then depositing metal into the trench. Alternatively, a subtractive flow refers to processes of forming interconnect structures by depositing metal, and then etching the metal to form the interconnect structures. One benefit of a subtractive flow is the absence of an interface between lines and vias because they were formed at the same time during a single, initial deposition of metal material.

As semiconductor technology continues to be scaled down in size, practical limitations arise in terms of reliable fabrication processing. For example, simultaneous patterning of interconnects and devices in various areas of a die becomes increasingly challenging. Some of the main process challenges include the consumption of the interconnect capping layer by IBE, the formation of seams and voids in dielectric fills, dielectric and metal damage causing high resistive-capacitive delays, metal sidewall damage, and dielectric cap damage causing electromigration.

In particular, subtractive formation of pillars (such as, for example, for magnetoresistive random-access memory (MRAM) devices, other memory devices, or even other interconnect devices), utilizes IBE or another etch to form interconnects. This introduces the risk of inadvertently eroding the dielectric in other areas, which can expose underlying metal lines. Such exposure can cause damage, such as by electromigration, in addition to other problems.

Embodiments of the present disclosure may overcome these and other drawbacks of existing solutions by forming lower level interconnect structures after forming associated devices or pillars. Accordingly, the lower level interconnect structures are not yet present, and therefore not susceptible to damage, during processes that are specific to fabrication of the associated devices or pillars. As discussed in further detail below, such embodiments may prevent damage to dielectrics while patterning interconnects, thereby improving device reliability with low resistive-capacitive delay. Additionally, such embodiments facilitate decoupled interconnects for a variety of device sizes and design configurations.

This disclosure pertains to subtractive schemes (also referred to as subtractive flows) in which a layer of metal material is deposited on a substrate, some of the metal material is selectively etched away to leave behind lines of the metal material, and vias are formed on top of the lines.

FIG. 1 depicts an example method 100 of forming a semiconductor component in accordance with embodiments of the present disclosure. The following description discloses a method of making a semiconductor component according to the disclosure. Additionally, the following description discloses the structure of a semiconductor component produced by the performance of the disclosed method.

In accordance with at least some embodiments of the present disclosure, some portions of a semiconductor device, such as a memory device, are formed prior to beginning the method 100. In other words, in accordance with at least some embodiments, some portions of a semiconductor device are provided or prepared prior to beginning the method 100. In accordance with at least some alternative embodiments of the present disclosure, the method 100 can include providing or preparing the portions of the semiconductor device.

More specifically, prior to the performance of operation 104, a bottom interconnect structure of metal material is formed in a bottom dielectric layer. In particular, the bottom interconnect structure is formed such that an uppermost surface of the bottom interconnect structure is substantially level, or substantially co-planar, with an uppermost surface of the bottom dielectric layer. This can be accomplished by, for example, performing CMP on the bottom interconnect structure and bottom dielectric layer.

In accordance with at least some embodiments of the present disclosure, the bottom interconnect structure can be a horizontal line that can be formed by a subtractive flow or by a damascene flow. In accordance with at least some embodiments of the present disclosure, the bottom interconnect structure can be a metal landing pad for a semiconductor device, such as a memory device. In accordance with at least some embodiments of the present disclosure, the bottom interconnect layer can be made of, for example, Cu, Al, W, Co, Ru, Rh, or alloys thereof.

Additionally, prior to the performance of operation 104, an insulative layer is arranged on top of the bottom dielectric material and the bottom interconnect structure. In particular, the insulative layer is formed such that a lowermost surface of the insulative layer is arranged on top of the uppermost surfaces of the bottom dielectric material and the bottom interconnect structure so as to cover the uppermost surfaces of the bottom dielectric material and the bottom interconnect structure. In other words, the uppermost surface of the bottom interconnect structure is not arranged above the lowermost surface of the insulative layer. More specifically, the uppermost surface of the bottom interconnect structure is arranged below the lowermost surface of the insulative layer.

In accordance with at least one embodiment of the present disclosure, the insulative layer can be formed such that the lowermost surface of the insulative layer is in direct contact with the uppermost surfaces of the bottom dielectric material and the bottom interconnect structure. In such embodiments, a height between the lowermost surface of the insulative layer and the uppermost surfaces of the bottom interconnect structure is equal to zero or is nearly equal to zero.

In accordance with at least one embodiment of the present disclosure, the lowermost surface of the insulative layer is substantially planar. In such embodiments, the insulative layer can be formed such that the lowermost surface of the insulative layer is substantially co-planar with the uppermost surfaces of the bottom dielectric material and the bottom interconnect structure.

In accordance with at least one embodiment of the present disclosure, the insulative layer can have a thickness of between approximately 5 nanometers and approximately 200 nanometers. In accordance with at least one embodiment of the present disclosure, the insulative layer can be made out of a material such as, for example, SiC, SiN, SiC(N, H), SiO2, or SiC(N, O, H).

Additionally, prior to the performance of operation 104, a device is connected to the bottom interconnect structure such that the device extends through the insulative layer. In accordance with at least some embodiments of the present disclosure, the device is in direct contact with the bottom interconnect structure. The device can be, for example, a horizontal line, a vertical via, an interconnect, a metal stack, or a memory stack. If the device is a memory stack, the device can be, for example, an MRAM stack or a phase-change memory (PCM) stack.

In accordance with at least some embodiments of the present disclosure, the device includes a pillar that is formed so as to be in direct contact with the bottom interconnect structure and such that the pillar extends through the insulative layer. In accordance with at least some embodiments of the present disclosure, the device also includes a bottom electrode contact, such as a via, in addition to the pillar. In such embodiments, the bottom electrode contact is in direct contact with the bottom interconnect structure and is arranged so as to extend through the insulative layer. In such embodiments, the pillar is arranged above the insulative layer and is connected to the bottom interconnect structure by the bottom electrode contact. In such embodiments, the bottom electrode contact can be made of, for example, W, Cu, Al, Ta, Co, Ru, or Rh.

Notably, the bottom electrode contact may or may not be present depending on the particular device and application. More specifically, the fabrication processes required for forming some semiconductor devices will require the presence of a bottom electrode contact, while others will not. For example, if the pillar is an MRAM pillar, the device will include a bottom electrode contact due to the fabrication processes and interfaces required for forming an MRAM device. If, in contrast, the pillar is a PCM pillar, the device may not include a bottom electrode contact due to the different fabrication processes and interfaces required for forming a PCM device. The present disclosure applies equally to embodiments with and without a discrete bottom electrode contact.

Figure 2A:
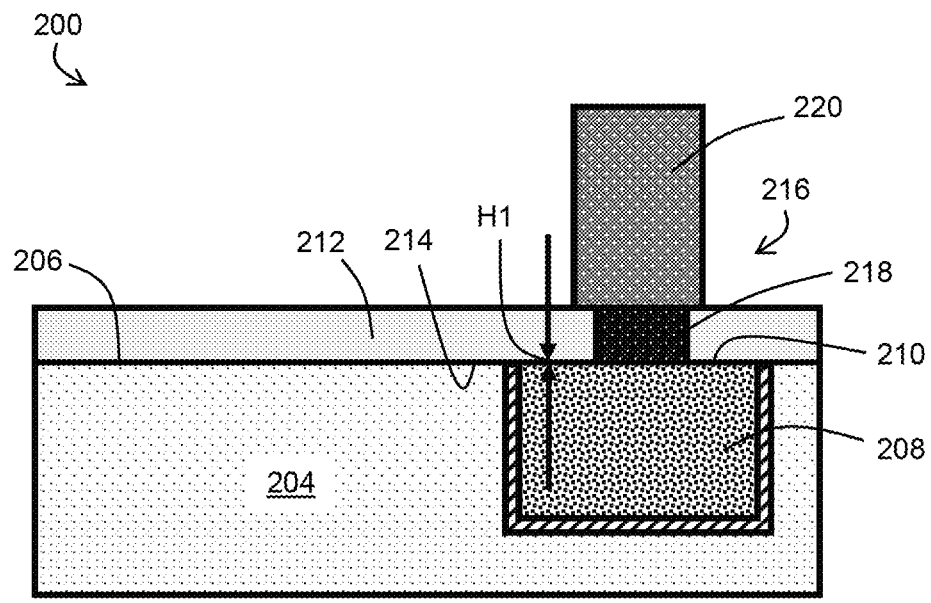
FIG. 2A illustrates an example of a component following the performance of a portion of the example method of FIG. 1, in accordance with embodiments of the present disclosure.

FIG. 2A depicts an example structure 200 following the provision or preparation of the portions of the semiconductor device described above. Accordingly, the structure 200 includes a bottom dielectric material 204 and a bottom interconnect structure 208 formed in the bottom dielectric material 204. As shown, the bottom interconnect structure 208 has an uppermost surface 210 that is substantially co-planar with an uppermost surface 206 of the bottom dielectric material 204. In the example structure 200 discussed herein, the bottom interconnect structure 208 is a horizontal line of a semiconductor component. In alternative embodiments, the bottom interconnect structure 208 can also be a landing pad of a semiconductor component. The bottom interconnect structure 208 includes a liner (not independently labeled).

The structure 200 also includes an insulative layer 212 formed on top of, and in direct contact with, the bottom dielectric material 204 and bottom interconnect structure 208. As shown, the insulative layer 212 is formed such that a lowermost surface 214 of the insulative layer 212 is in direct contact with the uppermost surfaces 206, 210 of the bottom dielectric material 204 and bottom interconnect structure 208.

As shown, the bottom interconnect structure 208 is arranged in the bottom dielectric material 204 such that the uppermost surface 210 of the bottom interconnect structure 208 is arranged at a first height H1 relative to the lowermost surface 214 of the insulative layer 212. Because the insulative layer 212 is formed such that the lowermost surface 214 is in direct contact with the uppermost surface 210 of the bottom interconnect structure 208, the first height H1 is equal to zero or is nearly equal to zero.

The structure 200 also includes a device 216 connected to the bottom interconnect structure 208 through the insulative layer 212. More specifically, the device 216 includes a bottom electrode contact 218 and a pillar 220. The bottom electrode contact 218 is arranged so as to extend through the insulative layer 212 such that the bottom electrode contact 218 is in direct contact with the bottom interconnect structure 208 and the pillar 220. The pillar 220 is connected to the bottom interconnect structure 208 by the bottom electrode contact 218 and is otherwise separated from the bottom interconnect structure 208 by the insulative layer 212. In other words, the pillar 220 is arranged above the insulative layer 212.

Returning to FIG. 1, at operation 104, a second interconnect structure is formed. More specifically, the second interconnect structure is formed so as to extend through the insulative layer. In accordance with at least one embodiment of the present disclosure, the performance of operation 104 can include the performance of one or more sub-operations.

As discussed in further detail below, by forming the second interconnect structure separately from the first interconnect structure, the method 100 enables the second interconnect structure to be formed at a different depth than the first interconnect structure. In contrast, this is not possible when the first interconnect structure and the second interconnect structure are formed at the same time, as is common in fabrication processes. In other words, the method 100 forms decoupled interconnect structures.

In accordance with at least one embodiment of the present disclosure, forming the second interconnect structure includes depositing an interlayer dielectric (ILD) material over the structure.

Figure 2B:
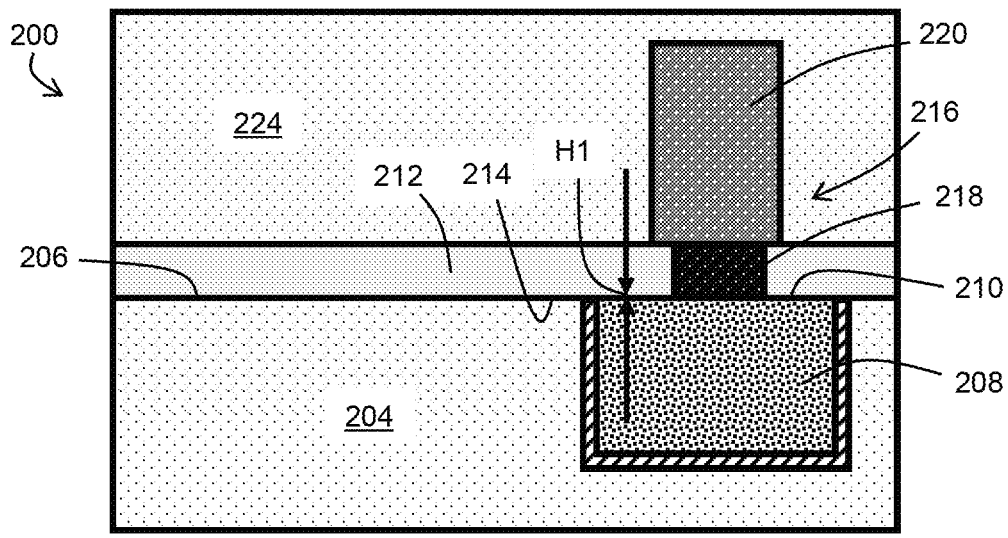
FIG. 2B illustrates an example of a component following the performance of a portion of the example method of FIG. 1, in accordance with embodiments of the present disclosure.

FIG. 2B depicts the structure 200 following the performance of this sub-operation. As shown, the structure 200 further includes the deposited ILD 224.

In accordance with at least one embodiment of the present disclosure, forming the second interconnect structure includes applying a block mask or a lithographic mask to pattern and remove the ILD from the logic area of the structure. The patterned ILD may be removed, for example, by etching. Accordingly, in such embodiments, the ILD remains only in the memory area of the structure. In accordance with at least one illustrative embodiment, the performance of this operation includes removing the ILD, but not removing the insulative layer with the ILD. In accordance with at least one alternative embodiment, the insulative layer can be removed together with the ILD.

Figure 2C:
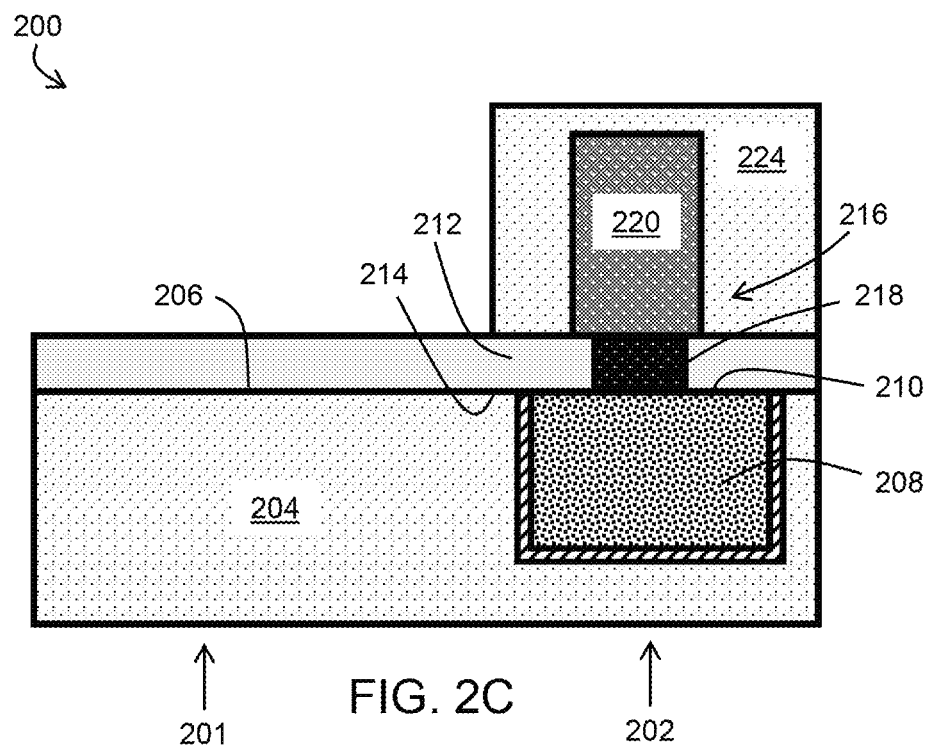
FIG. 2C illustrates an example of a component following the performance of a portion of the example method of FIG. 1, in accordance with embodiments of the present disclosure.

FIG. 2C depicts the structure 200 following the performance of this sub-operation. As shown, the ILD 224 has been removed from the logic area 201 and remains in the memory area 202 of the structure 200.

In accordance with at least one embodiment of the present disclosure, forming the second interconnect structure includes filling the structure with an organic planarizing layer (OPL), performing lithographic patterning (such as, for example, a tri-layer or quad-layer stack), and etching to selectively remove portions of the insulative layer and bottom dielectric material to form a trench. The resulting trench extends through the insulative layer and into the bottom dielectric material.

Figure 2D:
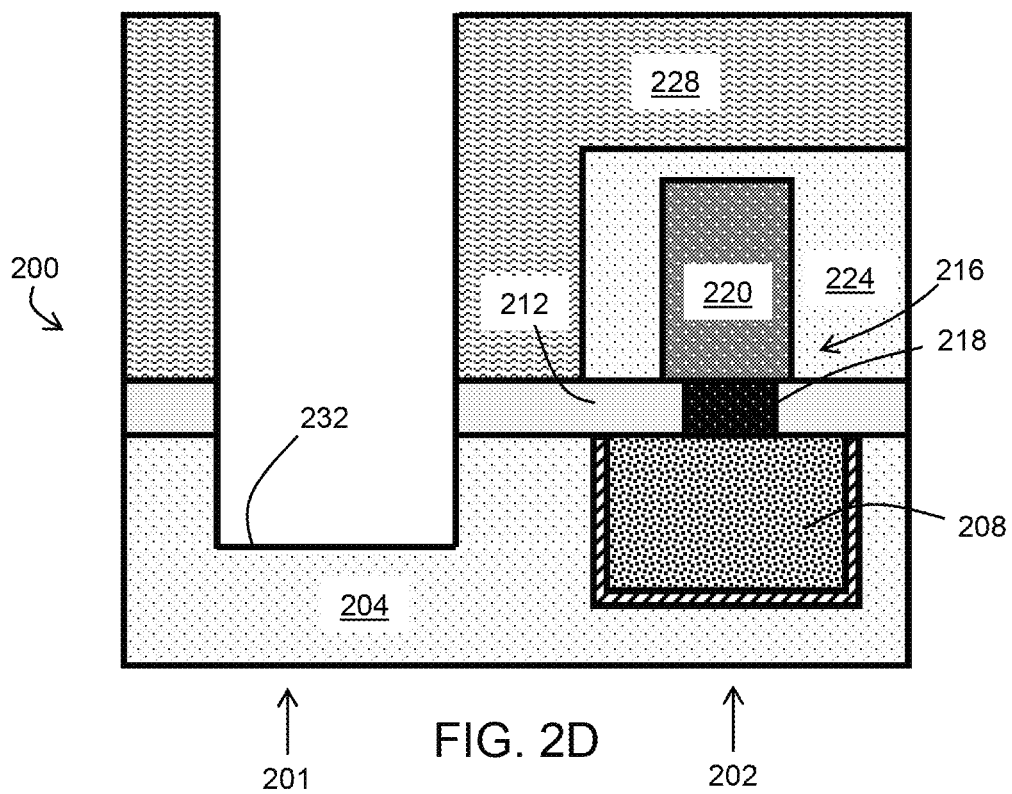
FIG. 2D illustrates an example of a component following the performance of a portion of the example method of FIG. 1, in accordance with embodiments of the present disclosure.

FIG. 2D depicts the structure 200 following the performance of this sub-operation. As shown, the structure 200 has been filled with an OPL 228. The OPL 228 has been patterned, and an etch has been performed to remove the bottom dielectric material 204 to form a trench 232.

In accordance with at least one embodiment of the present disclosure, forming the second interconnect structure includes removing the remaining OPL using, for example, an OPL ash procedure.

Figure 2E:
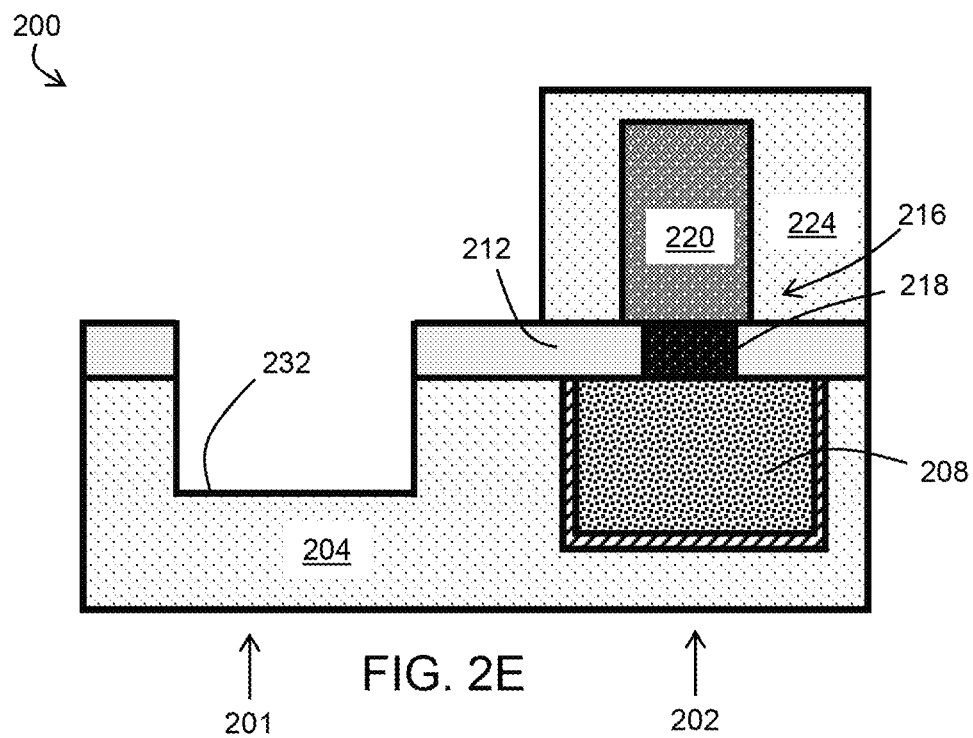
FIG. 2E illustrates an example of a component following the performance of a portion of the example method of FIG. 1, in accordance with embodiments of the present disclosure.

FIG. 2E depicts the structure 200 following the performance of this sub-operation. As shown, the OPL 228 (shown in FIG. 2D) has been removed from the structure 200.

In accordance with at least one embodiment of the present disclosure, forming the second interconnect structure includes depositing a metal liner on the structure, including in the trench. The metal liner will subsequently be used for a selective bottom-fill of the trench with a metal material to form the second interconnect structure. More specifically, the metal material that will be used to form the second interconnect structure will be one that only adheres to the material of the metal liner. Accordingly, the material that is used for the metal liner is one that will be appropriate for the selective metal-on-metal deposition in subsequent processes.

Figure 2F:
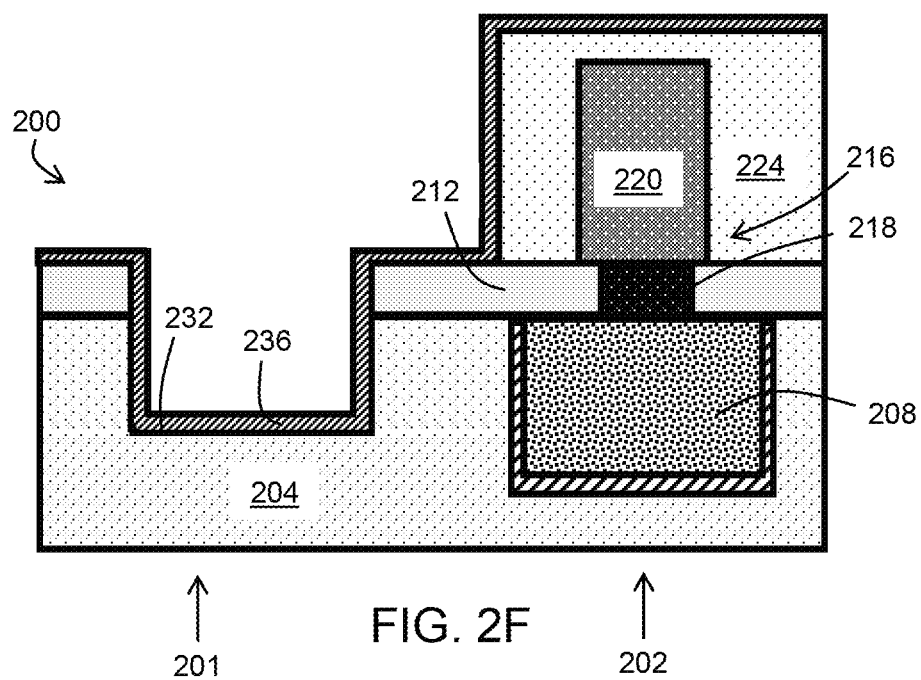
FIG. 2F illustrates an example of a component following the performance of a portion of the example method of FIG. 1, in accordance with embodiments of the present disclosure.

FIG. 2F depicts the structure 200 following the performance of this sub-operation. As shown, a metal liner 236 has been deposited on the structure 200, including in the trench 232. The metal liner 236 will subsequently be removed from everywhere except in the trench 232. This can be accomplished in the following processes.

In accordance with at least one embodiment of the present disclosure, forming the second interconnect structure includes filling the structure with a further OPL.

Figure 2G:
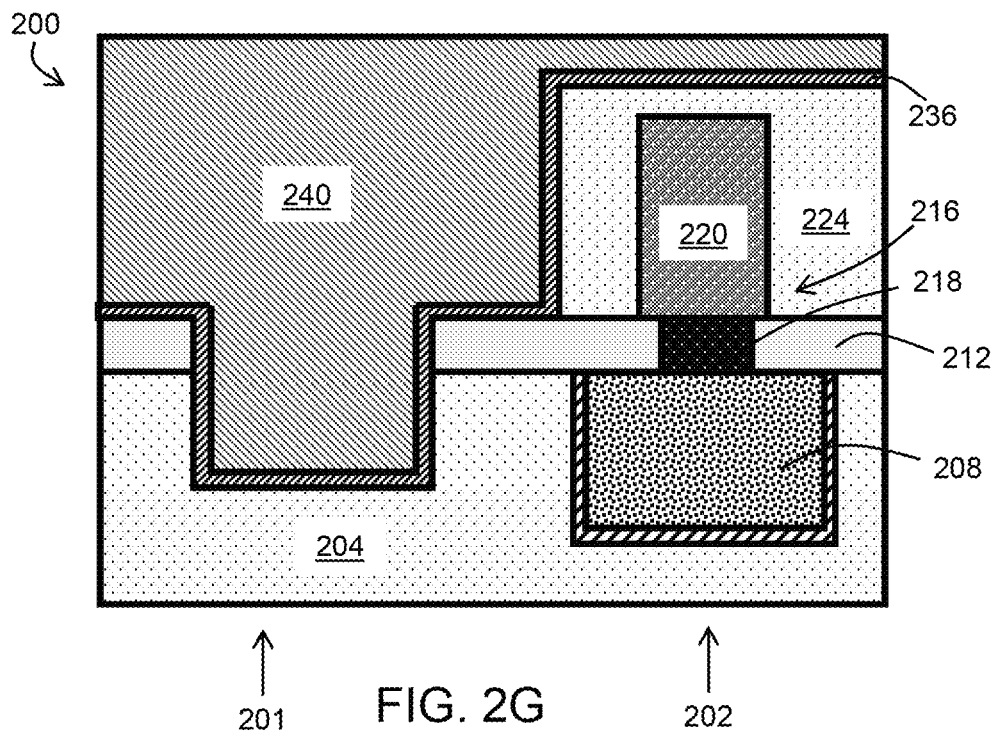
FIG. 2G illustrates an example of a component following the performance of a portion of the example method of FIG. 1, in accordance with embodiments of the present disclosure.

FIG. 2G depicts the structure 200 following the performance of this sub-operation. As shown, the structure 200 has been filled with a further OPL 240. Accordingly, the further OPL 240 is arranged on the metal liner 236, including in the trench 232.

In accordance with at least one embodiment of the present disclosure, forming the second interconnect structure includes performing a first selective OPL etch back. In particular, the first selective OPL etch back is performed such that the further OPL is removed from above the pillar and such that the thickness of the further OPL above the logic area is also reduced. As a result, in the first selective OPL etch back, the further OPL is removed from the memory area and a layer of the further OPL remains in the logic area.

Figure 2H:
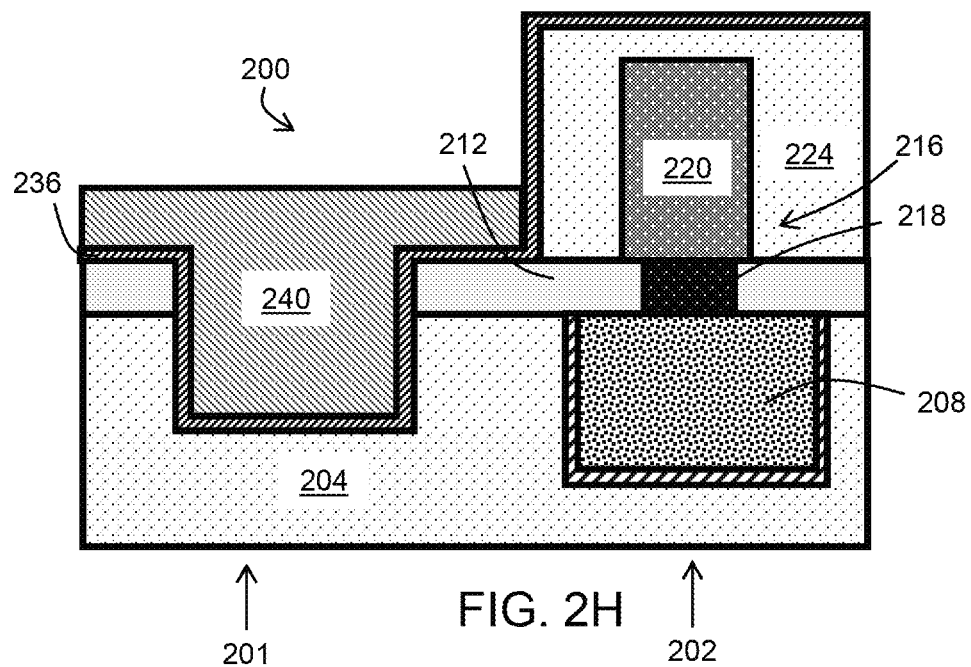
FIG. 2H illustrates an example of a component following the performance of a portion of the example method of FIG. 1, in accordance with embodiments of the present disclosure.

FIG. 2H depicts the structure 200 following the performance of this sub-operation. As shown, the further OPL 240 has been removed from the memory area 202 and a layer of the further OPL 240 remains in the logic area 201 of the structure 200.

In accordance with at least one embodiment of the present disclosure, forming the second interconnect structure includes performing an isotropic etch process to remove the metal liner from areas where the further OPL has been removed. The isotropic etch process can be an isotropic wet process, an isotropic dry process, or an isotropic RIE process. Because the further OPL has been removed from the memory area of the structure, performing this etch removes the metal liner from the memory area of the structure. Additionally, because the thickness of the layer of further OPL has been reduced adjacent to the memory area, performing this isotropic etch on the structure can also etch out some of the metal liner between the remaining further OPL and the ILD of the memory area to form an overhang under the remaining further OPL and on top of the insulative layer. Such an overhang promotes completeness of the selective removal of the metal liner in subsequent processes.

Figure 2I:
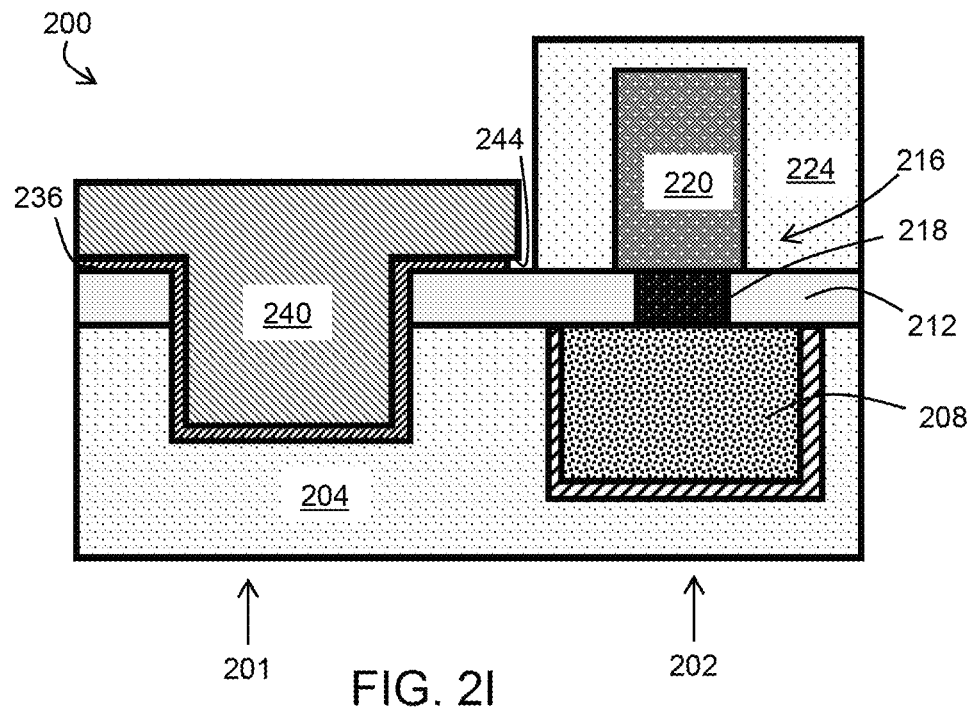
FIG. 2I illustrates an example of a component following the performance of a portion of the example method of FIG. 1, in accordance with embodiments of the present disclosure.

FIG. 2I depicts the structure 200 following the performance of this sub-operation. As shown, the metal liner 236 has been removed from the memory area 202 where the further OPL 240 had previously been removed. Additionally, an overhang 244 has been formed between the remaining further OPL 240 and the insulative layer 212 adjacent to where a vertical portion of the metal liner 236 that had been in contact with the vertical sidewall of the ILD 224 in the memory area 202 has been removed.

In accordance with at least one embodiment of the present disclosure, forming the second interconnect structure includes performing a second selective OPL etch back and a metal liner removal using a process such as an isotropic RIE, a wet etch, a vapor etch, etc. In particular, the second selective OPL etch back is performed such that the further OPL remains only in the trench. Because the further OPL is removed from the rest of the logic area besides the trench, the metal liner is exposed in the logic area except in the trench. Accordingly, the RIE removes the exposed metal liner from the logic area except in the trench.

Figure 2J:
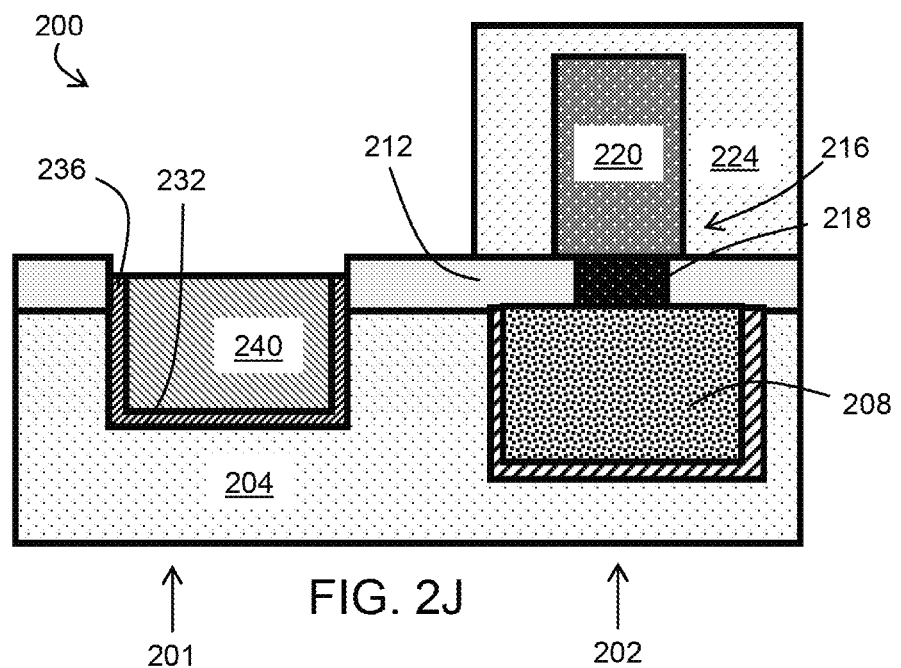
FIG. 2J illustrates an example of a component following the performance of a portion of the example method of FIG. 1, in accordance with embodiments of the present disclosure.

FIG. 2J depicts the structure 200 following the performance of this sub-operation. As shown, the further OPL 240 has been removed from the logic area 201 except for in the trench 232. Subsequently, the metal liner 236 has been removed from the logic area 201 except for in the trench 232.

In accordance with some embodiments of the present disclosure, as shown in FIG. 2J, the height of the metal liner 236 can also be reduced slightly within the trench 232 to the extent that it presents a horizontal surface within the trench 232.

Because the RIE is only able to remove the metal liner 236 from horizontal surfaces, the overhang 244 (shown in FIG. 2I) facilitates the completeness of the removal of the metal liner 236 from every surface except for in the trench 232 by ensuring that all contact between the metal liner 236 and vertical surfaces of the structure 200 outside of the trench 232 have been eliminated.

In accordance with at least one embodiment of the present disclosure, forming the second interconnect structure includes performing an OPL ash procedure and a bottom-up selective metal-on-metal fill. More specifically, performing the OPL ash procedure removes the remaining further OPL from the trench. The bottom-up selective metal-on-metal fill is performed to fill only the trench, which is lined with the metal liner, with metal to form the second interconnect structure.

Figure 2K:
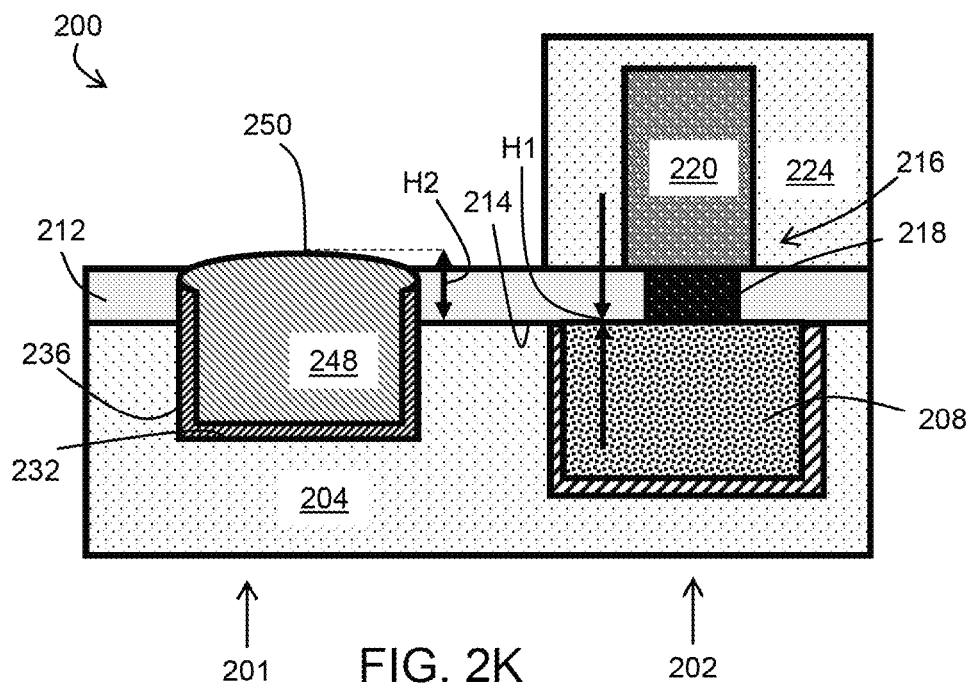
FIG. 2K illustrates an example of a component following the performance of a portion of the example method of FIG. 1, in accordance with embodiments of the present disclosure.

FIG. 2K depicts the structure 200 following the performance of this sub-operation. Moreover, FIG. 2K depicts the structure 200 following the performance of operation 104. As shown, the further OPL 240 (shown in FIG. 2J) has been removed from the trench 232, and the trench 232 has been filled with metal to form the second interconnect structure 248. Because the trench 232 is lined with the metal liner 236, and because the metal fill is a selective metal-on-metal fill, the metal that forms the second interconnect structure 248 is only deposited in the lined trench 232.

Because the second interconnect structure is formed after the first interconnect structure, in a separate process, the second interconnect structure can be made of a different material than the first interconnect structure, if desired.

As shown, like the bottom interconnect structure 208, the second interconnect structure 248 has an uppermost surface 250. However, unlike the bottom interconnect structure 208, the second interconnect structure 248 extends through the insulative layer 212 such that the uppermost surface 250 is above the lowermost surface 214 of the insulative layer 212. In other words, the uppermost surface 250 is arranged at a second height H2 relative to the lowermost surface 214 of the insulative layer 212, and the second height H2 is greater than the first height H1.

In alternative embodiments, the uppermost surface 250 of the second interconnect structure 248 can be formed below the uppermost surface 210 of the bottom interconnect structure 208. In either case, the second height H2 is greater than the first height H1. Because the bottom interconnect structure 208 and the second interconnect structure 248 are formed during separate processes, they can be formed at different levels relative to one another.

Returning to FIG. 1, at operation 108, a via is formed so as to be connected to the second interconnect structure. In accordance with at least one embodiment of the present disclosure, forming the via includes performing a subtractive flow on top of the second interconnect structure such that the via is a top via. In such embodiments, the performance of operation 108 further includes the performance of a number of sub-operations.

In particular, in accordance with at least one embodiment of the present disclosure, the performance of operation 108 includes depositing a metal over the structure. The deposited metal will be subtractively etched to form a via in a subsequent sub-operation. Accordingly, the deposited metal can be a material such as, for example, W, Co, TiN, TaN, or Al. The deposited metal should not be copper, as this is not a material that can be subtractively etched in subsequent processes.

The deposited metal can be a material that is the same as that of the second interconnect structure or the deposited metal can be a material that is different than that of the second interconnect structure. In either case, the deposited metal is in direct contact with the second interconnect structure such that the via will be integrally formed with the second interconnect structure.

Figure 2L:
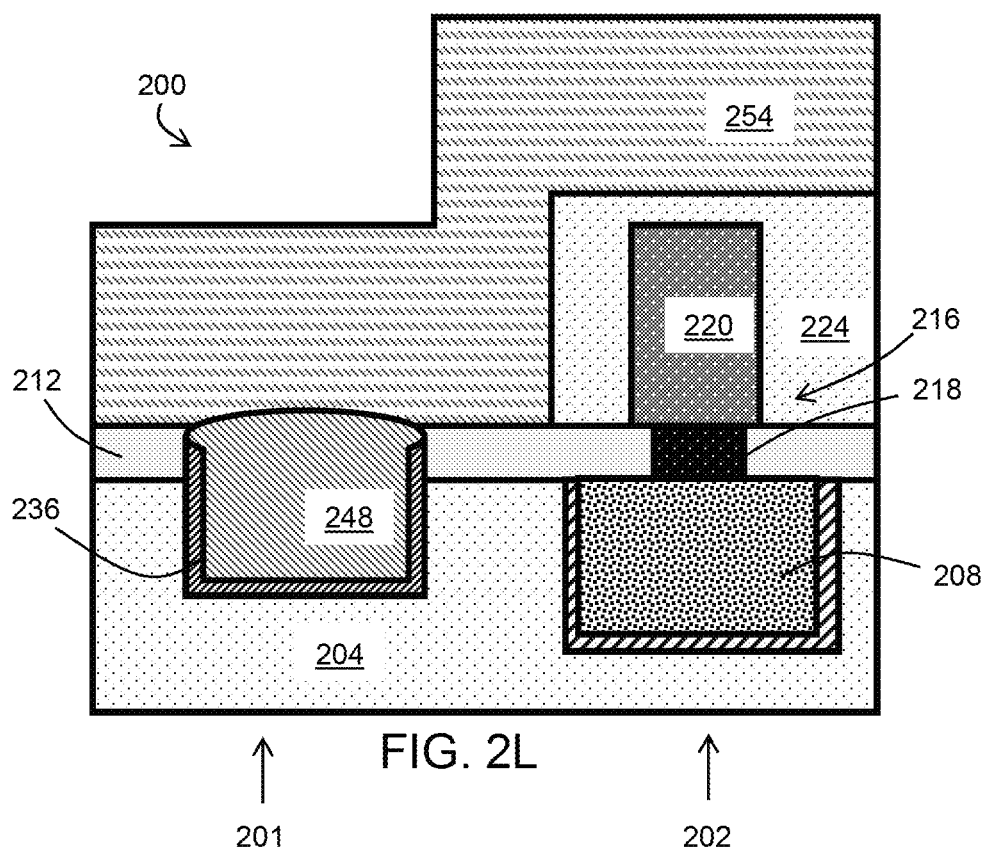
FIG. 2L illustrates an example of a component following the performance of a portion of the example method of FIG. 1, in accordance with embodiments of the present disclosure.

FIG. 2L depicts the structure 200 following the performance of this sub-operation. As shown, metal 254 has been deposited over the entire structure 200. Due to the topography created by the pillar 220 in the memory area 202, the top surface of the metal 254 is uneven. In particular, the top surface of the metal 254 is higher above the memory area 202 and is lower above the logic area 201 of the structure 200.

Figure 2M:
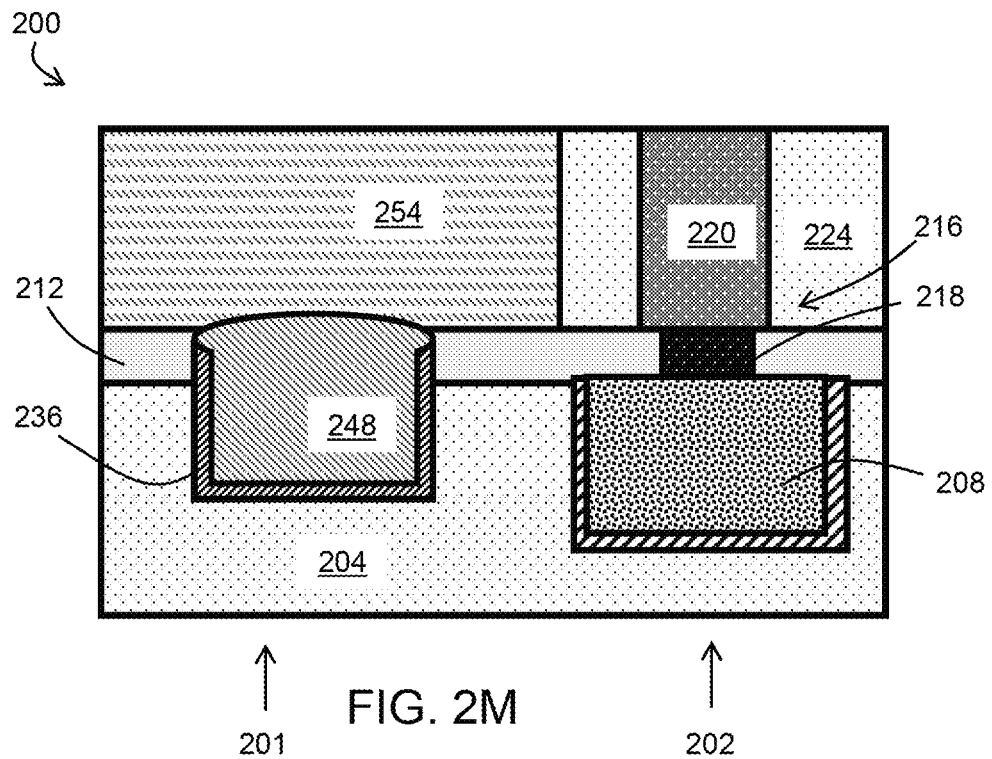
FIG. 2M illustrates an example of a component following the performance of a portion of the example method of FIG. 1, in accordance with embodiments of the present disclosure.
Figure 2N:
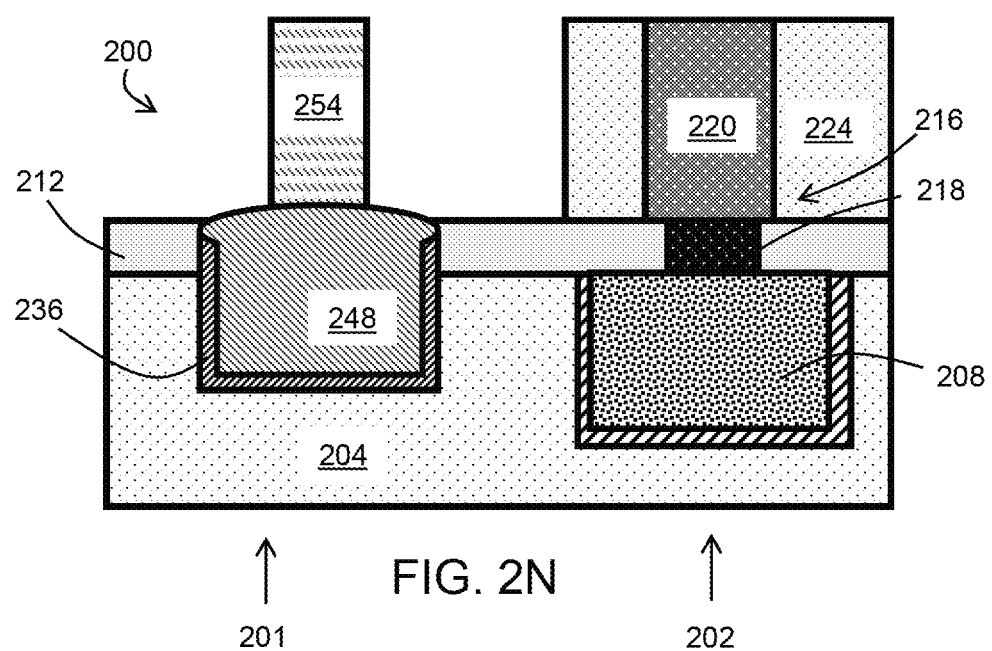
FIG. 2N illustrates an example of a component following the performance of a portion of the example method of FIG. 1, in accordance with embodiments of the present disclosure.
Figure 2O:
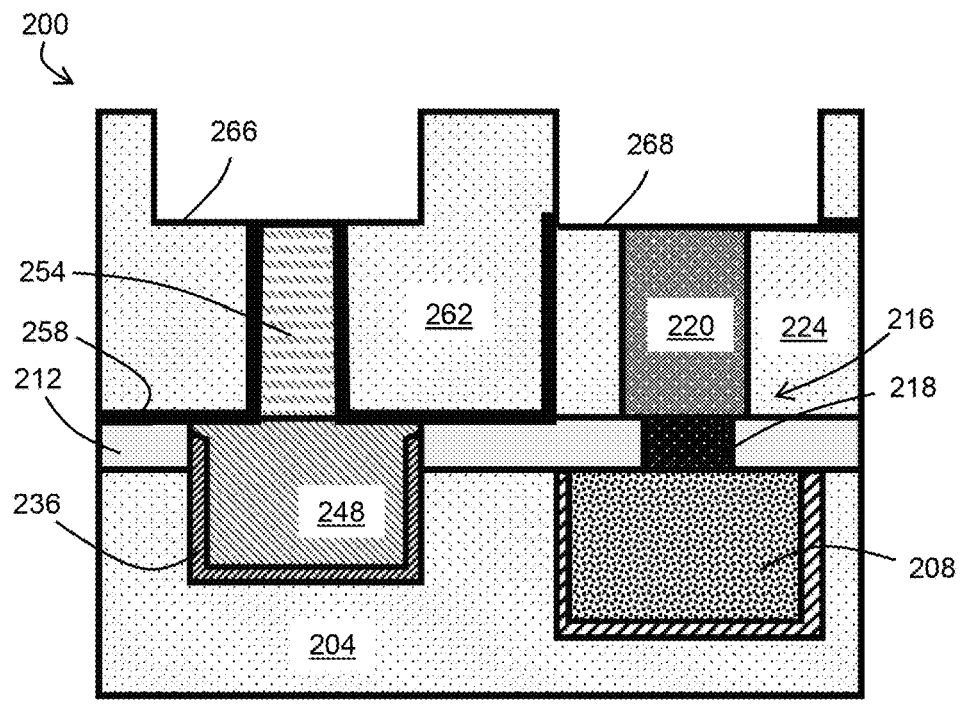
FIG. 2O illustrates an example of a component following the performance of a portion of the example method of FIG. 1, in accordance with embodiments of the present disclosure.
Figure 2P:
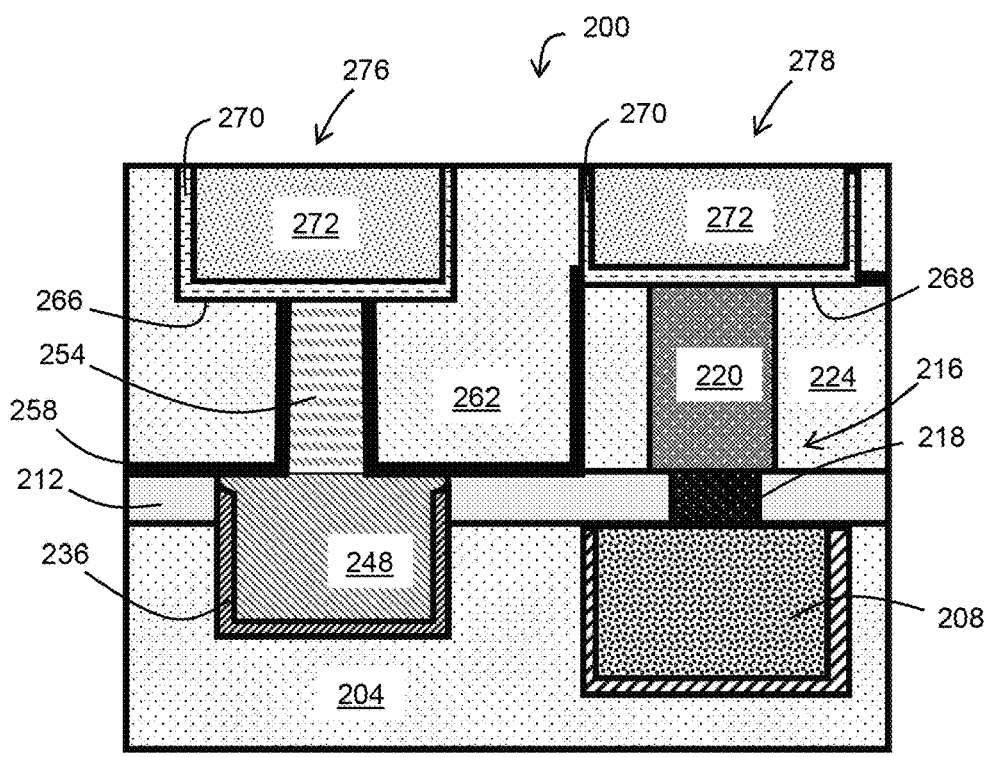
FIG. 2P illustrates an example of a component following the performance of a portion of the example method of FIG. 1, in accordance with embodiments of the present disclosure.
Figure 3A:
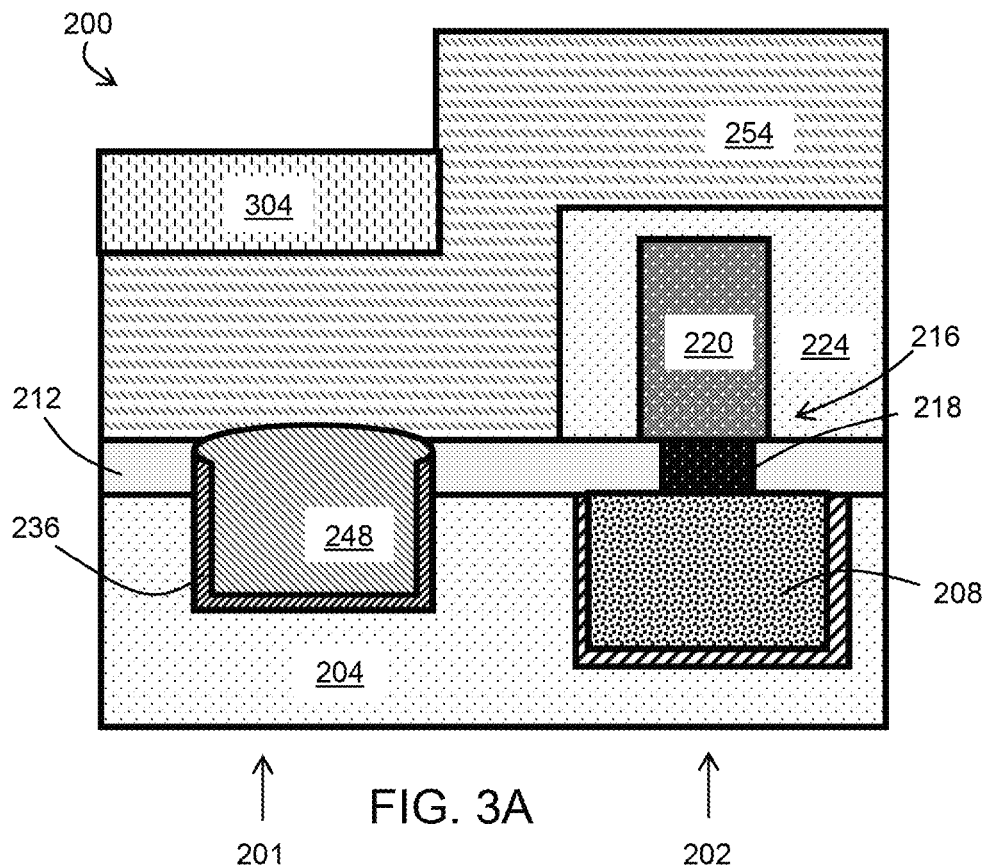
FIG. 3A illustrates an example of a component following the performance of a portion of the example method of FIG. 1, in accordance with embodiments of the present disclosure.
Figure 3B:
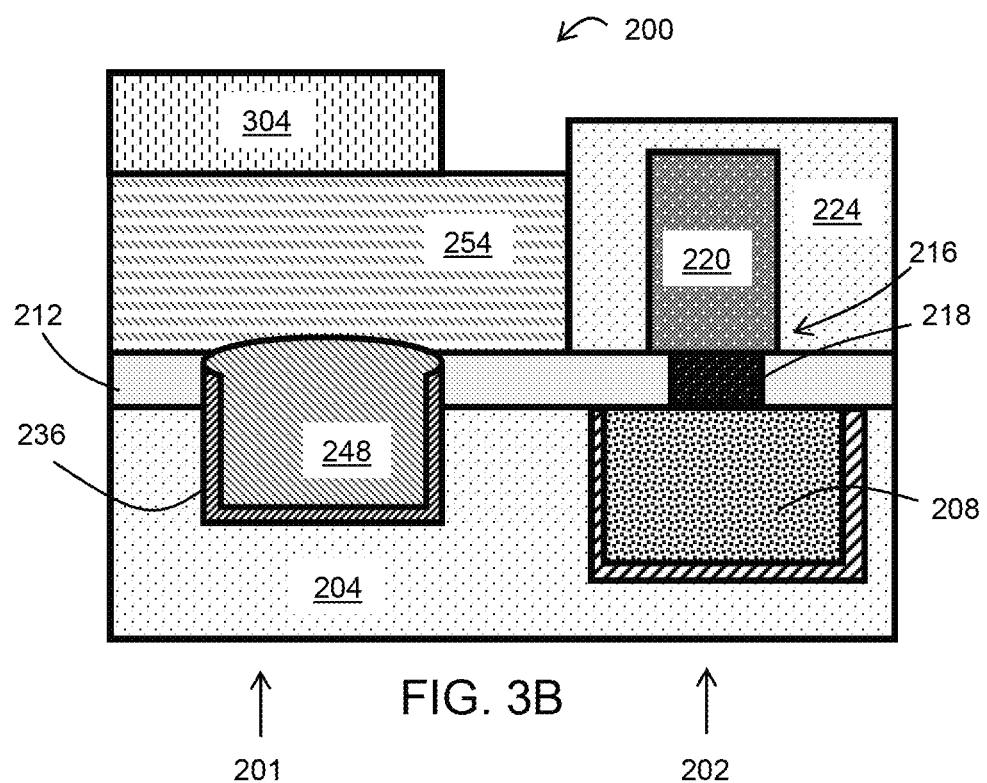
FIG. 3B illustrates an example of a component following the performance of a portion of the example method of FIG. 1, in accordance with embodiments of the present disclosure.
Figure 3C:
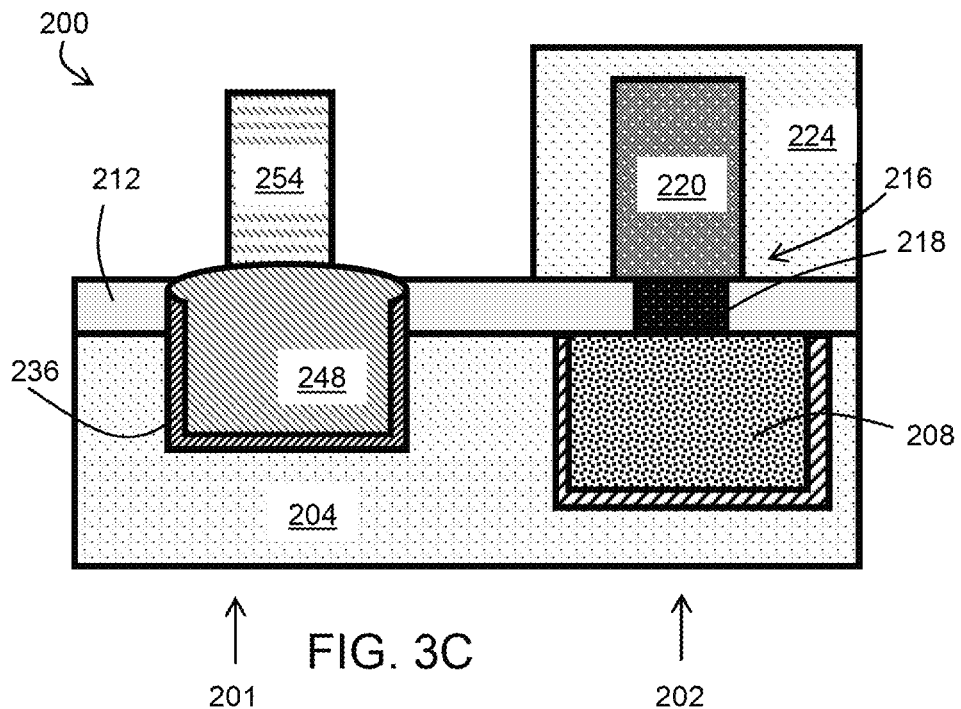
FIG. 3C illustrates an example of a component following the performance of a portion of the example method of FIG. 1, in accordance with embodiments of the present disclosure.

Following the performance of the sub-operation depicted in FIG. 2L, further performance of operation 108 can be achieved by more than one different combinations of further sub-operations. As discussed in further detail below, the structure following the performance of sub-operations of a first embodiment is illustrated in FIGS. 2M-2N, and the structure following the performance of sub-operations of a second embodiment is illustrated in FIGS. 3A-3C. Accordingly, FIG. 2N depicts the structure following the performance of operation 108 according to a first embodiment of the method 100, and FIG. 3C depicts the structure following the performance of operation 108 according to a second embodiment of the method 100. Following the performance of the sub-operations of either embodiment, the method 100 then proceeds with operation 112, as depicted in FIGS. 2O and 2P.

In accordance with the first embodiment, the performance of operation 108 includes performing CMP on the structure to provide a level and planar top surface on the structure.

FIG. 2M depicts the structure 200 following the performance of this sub-operation. As shown, to provide a level and planar top surface on the structure 200, the CMP has been performed so as to remove an amount of the ILD 224 and the pillar 220 from the memory area 202 in addition to removing an amount of the metal 254 from the entire structure 200. Alternatively, the CMP can be selective to the top of the pillar 220 such that an amount of the ILD 224 is removed, but an amount of the pillar 220 is not removed.

In accordance with the first embodiment, the performance of operation 108 further includes performing subtractive top via patterning (such as lithographic patterning) and a subtractive etch to form the top via on top of the second interconnect structure.

FIG. 2N depicts the structure 200 following the performance of this sub-operation. Moreover, as noted above, FIG. 2N depicts the structure 200 following the performance of the sub-operations of the first embodiment of operation 108. As shown, the deposited metal 254 has been selectively removed except where it remains as the via. Accordingly, the structure 200 as depicted in FIG. 2N is prepared for the performance of operation 112 of the method 100.

In accordance with the second embodiment, the performance of operation 108 includes applying an OPL coating on the lower portion of the metal in the logic area, the lower portion formed by the topography created by the pillar in the memory area of the structure.

FIG. 3A depicts the structure 200 following the performance of this sub-operation. As shown, the OPL coating 304 is applied on the lower portion of the metal 254 that is arranged in the logic area 201 of the structure 200.

In accordance with the second embodiment, the performance of operation 108 further includes performing a dry or wet removal of metal selective to a plane level with the bottom of the OPL coating. Accordingly, the metal is removed from the structure above the memory area. The metal may also be removed from the structure above some portion of the logic area, based on the topography and resulting OPL coverage.

FIG. 3B depicts the structure 200 following the performance of this sub-operation. As shown, the metal 254 has been removed down to the bottom of the OPL coating 304. Accordingly, the metal 254 remains above the logic area 201 of the structure 200.

In accordance with the second embodiment, the performance of operation 108 further includes performing an OPL etch to remove the OPL. The performance of operation 108 further includes performing subtractive top via patterning and a subtractive etch to form the top via on top of the second interconnect structure.

FIG. 3C depicts the structure 200 following the performance of this sub-operation. Moreover, as noted above, FIG. 3C depicts the structure 200 following the performance of the sub-operations of the first embodiment of operation 108. As shown, the deposited metal 254 has been selectively removed except where it remains as the via. Accordingly, the structure 200 as depicted in FIG. 3C is prepared for the performance of operation 112 of the method 100.

Of note, the structure 200 as depicted in FIG. 3C differs from the structure 200 as depicted in FIG. 2N because the second embodiment does not include performing CMP.

Therefore, in FIG. 3C, some ILD 224 remains above the pillar 220, and the pillar 220 remains isolated by the ILD 224. In contrast, because the first embodiment does include performing CMP, the structure 200 depicted in FIG. 2N does not include ILD 224 above the pillar 220, and the top surface of the pillar 220 is exposed.

Returning to FIG. 1, at operation 112 of the method 100, top metal lines are formed in the structure. As noted above, the method 100 proceeds in the same way from the structure as depicted in either of FIG. 2N (which results from performance of the first embodiment of operation 108) or FIG. 3C (which results from performance of the second embodiment of operation 108). In accordance with at least one embodiment of the present disclosure, the performance of operation 112 includes the performance of a number of sub-operations.

In particular, in accordance with at least one embodiment of the present disclosure, the performance of operation 112 includes covering the structure with a dielectric liner to cover the exposed metal of the second interconnect structure and via. This prevents the exposed metal from becoming oxidized or otherwise unintentionally degraded during a subsequent ILD deposition process.

For structures formed according to the first embodiment of operation 108, the dielectric liner will be spaced lower relative to the pillar, because the CMP procedure used in the first embodiment did not leave any ILD remaining above the top of the pillar. In contrast, for structures formed according to the second embodiment of operation 108, the dielectric liner will be spaced higher relative to the pillar, because the second embodiment did leave ILD remaining above the top of the pillar.

In accordance with at least one embodiment of the present disclosure, the performance of operation 112 further includes filling the structure with an ILD. In such embodiments, the performance of operation 112 further includes patterning and etching the ILD to form line trenches in the top surface of the structure.

FIG. 2O depicts the structure 200 following the performance of these sub-operations. As shown, the structure 200 has been covered with a dielectric liner 258. Because some ILD 224 remained in the memory area 202 surrounding the pillar 220, the dielectric liner 258 also covers the exposed portions of the ILD 224 and the pillar 220. Accordingly, the dielectric liner 258 covers exposed surfaces of the insulative layer 212, the second interconnect structure 248, and the via 254 in the logic area 201, and exposed surfaces of the remaining ILD 224 and the pillar 220 in the memory area 202 of the structure 200. The structure 200 has subsequently been filled with a further ILD 262. The further ILD 262 was then patterned and etched to form a first trench 266 and a second trench 268. The trenches 266, 268 extend through the further ILD 262 and the dielectric liner 258. Accordingly, the first trench 266 exposes a top surface of the via 254, and the second trench 268 exposes a top surface of the pillar 220.

In accordance with at least one embodiment of the present disclosure, the performance of operation 112 further includes lining and metallizing the trenches to form top metal lines in the structure.

FIG. 2P depicts the structure 200 following the performance of these sub-operations. Moreover, FIG. 2P depicts the structure 200 following the performance of operation 112. As shown, each of the trenches 266, 268 has been lined and metallized. The liner 270 and metal 272 in the first trench 266 form a first top line 276 connected to the via 254 and, therefore, to the second interconnect structure 248. The liner 270 and metal 272 in the second trench 268 form a second top line 278 connected to the pillar 220, and, therefore, to the bottom interconnect structure 208.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

Notably, the method 100 can be performed to form structures having a variety of device sizes, design configurations, and feature arrangements. For example, in addition to the structure 200 shown in FIG. 2P, the structures 400, 500, and 600 shown in FIGS. 4-6, respectively, can also be formed by performing the method 100 described above. Accordingly, the structures 400, 500, and 600 have similar features and functions as the structure 200, which are indicated with corresponding reference numerals. However, each of the structures 400, 500, and 600 differs from the structure 200 in a manner that can be achieved within the performance of the method 100 as discussed in further detail below.

Figure 4:
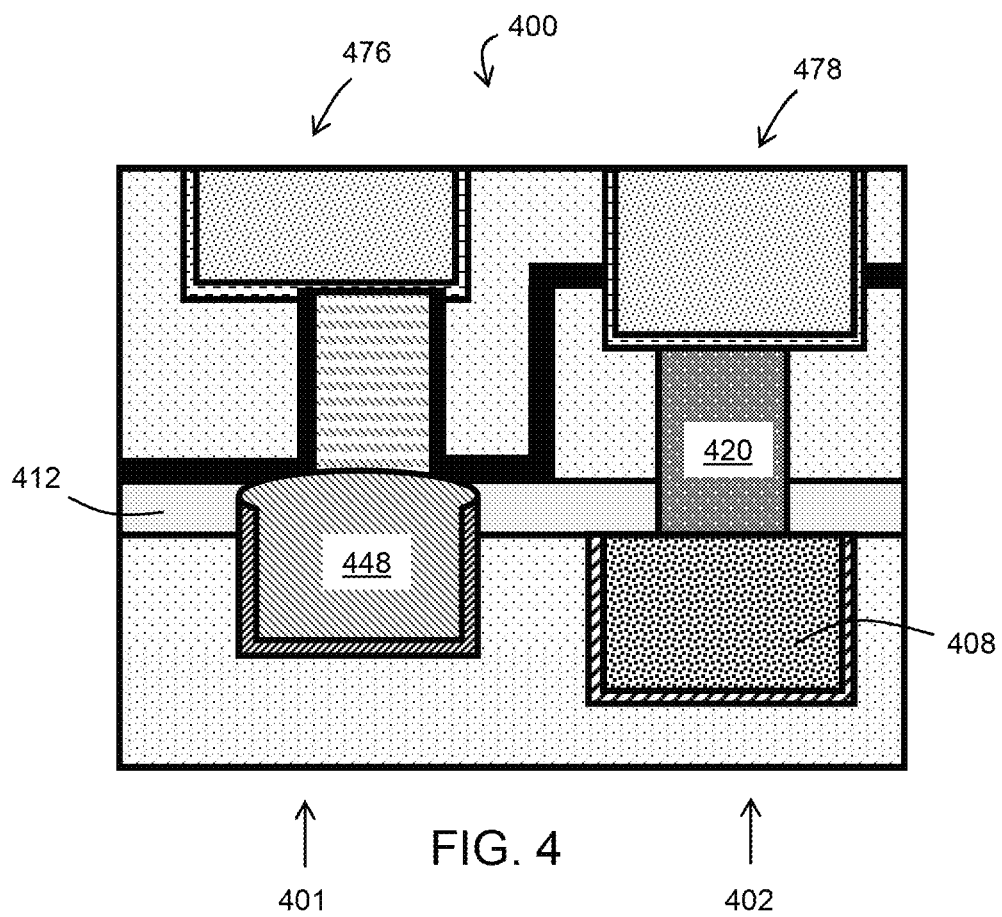
FIG. 4 illustrates an example of a component following the performance of the example method of FIG. 1, in accordance with embodiments of the present disclosure.

As shown in FIG. 4, the method 100 can be performed to form the structure 400 such that the pillar 420 extends from the bottom interconnect structure 408 to the second top line 478. Accordingly, in the embodiment of the structure 400 shown in FIG. 4, the pillar 420 extends through the insulative layer 412. Therefore, the structure 400 does not include a bottom electrode contact. As noted above, performing the method 100 to form the structure 400 may be useful for embodiments in which the pillar 420 is, for example, a PCM pillar, because the fabrication processes for forming such pillars do not require the presence of a bottom electrode contact.

In the illustrated embodiment, the structure 400 further includes a logic area 401, which includes a second interconnect structure 448 and a first top line 476, and a memory area 402, which includes the pillar 420, the bottom interconnect structure 408, and the second top line 478. Likewise, the structure 400 further includes an insulative layer 412. Each of these features/layers may be substantially similar to, or the same as, the corresponding features/layers described above with respect to FIGS. 2A-3C.

Figure 5:
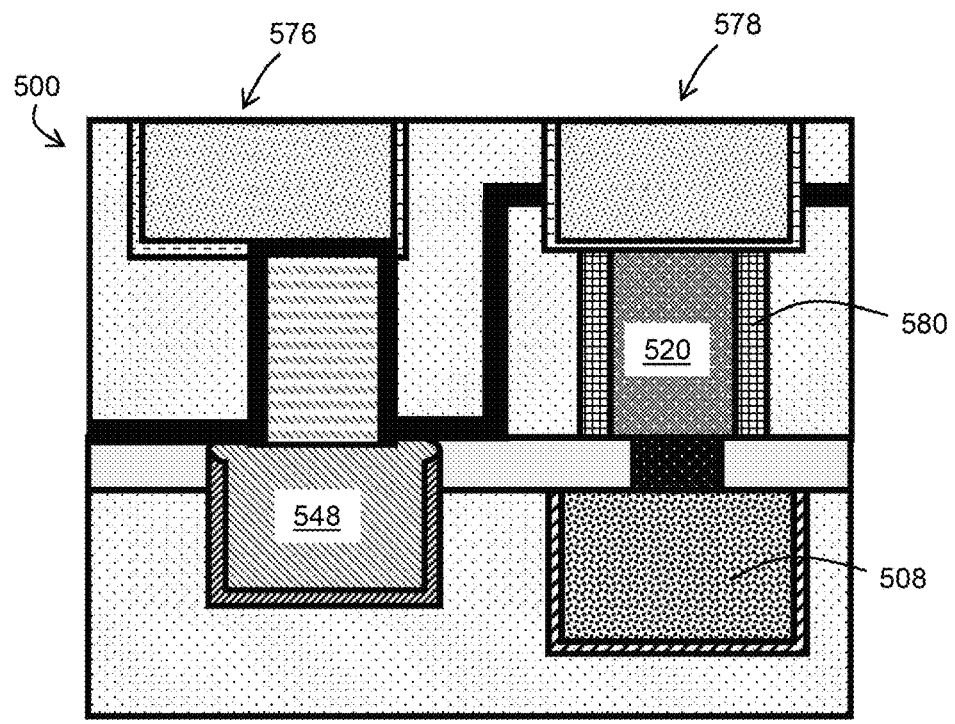
FIG. 5 illustrates an example of a component following the performance of the example method of FIG. 1, in accordance with embodiments of the present disclosure.

As shown in FIG. 5, the method 100 can be performed to form the structure 500 such that the pillar 520 is lined with a further insulator 580. The further insulator 580 can be made of, for example, SiC, SiN, SiC(N, H), SiO2, or SiC(N, O, H). The further insulator 580 provides separate encapsulation for the pillar 520 from surrounding structures and materials. Performing the method 100 to form the structure 500 may be useful for embodiments in which the pillar 520 is a memory structure that requires additional encapsulation.

In the illustrated embodiment, the structure 500 further includes a logic area 501, which includes a second interconnect structure 548 and a first top line 576, and a memory area 502, which includes the pillar 520, the bottom interconnect structure 508, and the second top line 578. Likewise, the structure 500 further includes an insulative layer. Each of these features/layers may be substantially similar to, or the same as, the corresponding features/layers described above with respect to FIGS. 2A-3C.

Figure 6:
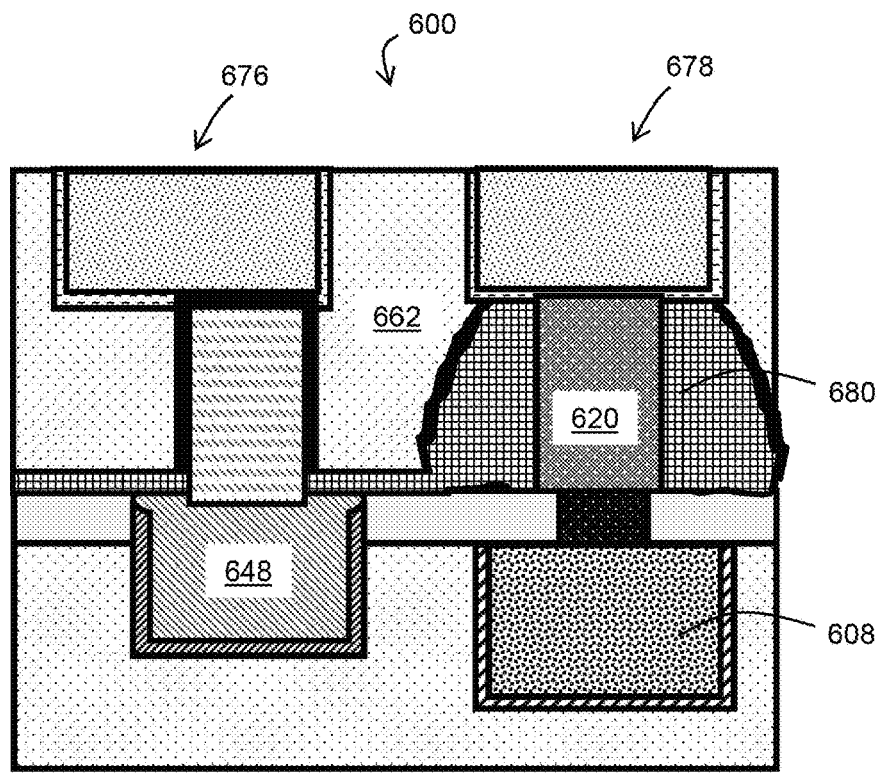
FIG. 6 illustrates an example of a component following the performance of the example method of FIG. 1, in accordance with embodiments of the present disclosure.

As shown in FIG. 6, the method 100 can be performed to form the structure 600 such that the pillar 620 is surrounded by a larger area of further insulator 680. The further insulator 680 can be made of, for example, SiC, SiN, SiC(N, H), SiO2, or SiC(N, O, H). Like the further insulator 580, the further insulator 680 provides separate encapsulation for the pillar 620. Additionally, the unique shape of the further insulator 680 is thicker at the bottom of the pillar 620 and also hasn't been etched away from the top of the insulative layer 612. The tapered shape of the further insulator 680 can facilitate consistency and robustness of the further ILD 662 that is deposited between features and elements of the structure 600 by reducing the formation of voids relative to the vertical shape of the further insulator 580 (shown in FIG. 5). The formation of fewer voids, and the improved consistency and robustness of the ILD 662, leads to fewer defects and a lower likelihood of damage during subsequent processing and usage of the structure 600.

In the illustrated embodiment, the structure 600 further includes a logic area 601, which includes a second interconnect structure 648 and a first top line 676, and a memory area 602, which includes the pillar 620, the bottom interconnect structure 608, and the second top line 678. Likewise, the structure 600 further includes an insulative layer. Each of these features/layers may be substantially similar to, or the same as, the corresponding features/layers described above with respect to FIGS. 2A-3C.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor component, comprising:
an insulative layer having a lowermost surface arranged on top of a bottom dielectric material;
a first interconnect structure arranged in the bottom dielectric material such that an uppermost surface of the first interconnect structure is arranged at a first height relative to the lowermost surface of the insulative layer;
a device connected to the first interconnect structure and extending through the insulative layer; and
a second interconnect structure arranged such that a lowermost surface of the second interconnect structure is below the lowermost surface of the insulative layer and such that an uppermost surface of the second interconnect structure is arranged at a second height relative to the lowermost surface of the insulative layer, the second height different than the first height.

2. The semiconductor component of claim 1, wherein:
the second height is greater than the first height.

3. The semiconductor component of claim 1, wherein:
the uppermost surface of the first interconnect structure is not arranged above the lowermost surface of the insulative layer.

4. The semiconductor component of claim 1, wherein:
the uppermost surface of the second interconnect structure is arranged above the lowermost surface of the insulative layer.

5. The semiconductor component of claim 1, wherein:
the lowermost surface of the insulative layer is substantially planar.

6. The semiconductor component of claim 1, wherein:
the uppermost surface of the first interconnect structure is in direct contact with the lowermost surface of the insulative layer.

7. The semiconductor component of claim 1, further comprising:
a via connected to the second interconnect structure.

8. The semiconductor component of claim 7, wherein:
each of the first and second interconnect structures is a line.

9. The semiconductor component of claim 1, wherein:
the device is a memory device.

10. The semiconductor component of claim 9, wherein:
the memory device includes a bottom electrode contact and a pillar;
the pillar is arranged above the insulative layer; and
the bottom electrode contact extends through the insulative layer.

11. The semiconductor component of claim 1, wherein:
the device is electrically isolated from the second interconnect structure.

12. The semiconductor component of claim 1, wherein:
the second interconnect structure extends through the insulative layer.

13. The semiconductor component of claim 7, wherein:
an uppermost surface of the via is substantially coplanar with an uppermost surface of the device.

* * * * *